(12) United States Patent
Shin

(10) Patent No.: US 7,847,609 B2
(45) Date of Patent: Dec. 7, 2010

(54) DUTY DETECTING CIRCUIT AND DUTY CYCLE CORRECTOR INCLUDING THE SAME

(75) Inventor: Dong-Suk Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/343,859

(22) Filed: Dec. 24, 2008

(65) Prior Publication Data
US 2010/0109729 A1    May 6, 2010

(30) Foreign Application Priority Data
Nov. 4, 2008    (KR) ...................... 10-2008-0108994

(51) Int. Cl.
*H03K 7/08* (2006.01)
(52) U.S. Cl. ...................................... 327/175; 327/172
(58) Field of Classification Search ........................ None
See application file for complete search history.

(56) References Cited

U.S. PATENT DOCUMENTS

| | | | | |
|---|---|---|---|---|
| 6,448,828 B2 * | 9/2002 | Stark et al. | .................. | 327/175 |
| 6,967,514 B2 * | 11/2005 | Kizer et al. | .................. | 327/175 |
| 7,184,509 B2 | 2/2007 | Cho et al. | | |
| 7,598,783 B2 * | 10/2009 | Shin et al. | .................... | 327/158 |
| 7,612,593 B2 * | 11/2009 | Kim et al. | .................... | 327/175 |
| 7,633,324 B2 * | 12/2009 | Yun et al. | .................... | 327/160 |

FOREIGN PATENT DOCUMENTS

| | | |
|---|---|---|
| KR | 1020050064241 A | 6/2005 |
| KR | 1020060000866 A | 1/2006 |
| KR | 100603179 | 7/2006 |
| KR | 100808594 | 3/2008 |
| KR | 1020080075286 | 8/2008 |

* cited by examiner

*Primary Examiner*—Cassandra Cox
(74) *Attorney, Agent, or Firm*—IP & T Group LLP

(57) ABSTRACT

A duty cycle corrector includes a duty adjusting unit configured to adjust a duty cycle of an input clock in response to a duty correction code and generate an output clock, a duty detecting unit configured to measure a difference between a high pulse width and a low pulse width of the output clock and output a difference value, and an accumulating unit configured to accumulate the difference value to generate the duty correction code.

17 Claims, 11 Drawing Sheets

DUTY DETECTING CIRCUIT AND DUTY CYCLE CORRECTOR INCLUDING THE SAME

CROSS-REFERENCE TO RELATED APPLICATION

The present invention claims priority of Korean patent application number 10-2008-0108994, filed on Nov. 4, 2008, which is incorporated by reference in its entirety.

BACKGROUND OF THE INVENTION

The present invention relates to a duty detecting circuit and a duty cycle corrector including the same, and more particularly, to a technology that can exactly measure a duty distortion degree at a time.

In semiconductor devices such as semiconductor memory devices designed to operate based on a clock, it is very important to exactly control a duty cycle of the clock. A 50% clock duty ratio means that a "high" level period is equal to a "low" level period in the clock.

A semiconductor memory device must input and output data exactly in synchronization with rising and falling edges of the clock. If the clock duty ratio is not exactly 50%, a timing between the rising edge and the falling edge is distorted so that data are not outputted and inputted at an accurate timing. Therefore, the semiconductor memory device uses a duty cycle corrector (DCC) to match the clock duty ratio to 50%.

Conventional duty cycle correctors have many limitations in correcting the clock duty cycle.

First, the conventional duty cycle correctors generate an up/down signal by comparing a high pulse width with a low pulse width of the clock and correct the duty ratio little by little according to the up/down signal. Such duty cycle correctors perform several comparison operations until completion of the duty cycle correction, which will increase a locking time.

Second, digital duty cycle correctors have difficulty in measuring an accurate duty ratio because of their own offset.

Third, there is a limitation in a frequency range of an input clock whose duty cycle will be corrected.

SUMMARY OF THE INVENTION

Embodiments of the present invention are directed to provide a duty cycle corrector which is capable of reducing a locking time, exactly correcting a duty cycle, and correcting duty cycles of clocks having various frequencies.

In accordance with an aspect of the present invention, there is provided a duty cycle corrector, including: a duty adjusting unit configured to adjust a duty cycle of an input clock in response to a duty correction code and generate an output clock; a duty detecting unit configured to measure a difference between a high pulse width and a low pulse width of the output clock and output a difference value; and an accumulating unit configured to accumulate the difference value to generate the duty correction code.

In accordance with an aspect of the present invention, there is provided a duty detecting circuit, including: a measuring unit configured to measure a high pulse width of a clock to generate a high pulse code, and measure a low pulse width of the clock to generate a low pulse code; a comparing unit configured to compare the high pulse code with the low pulse code to generate an up/down signal representing which code is larger; and a subtracting unit configured to generate a difference value by subtracting the smaller value from the larger value of the high pulse code and the low pulse code.

DESCRIPTION OF SPECIFIC EMBODIMENTS

Other objects and advantages of the present invention can be understood by the following description, and become apparent with reference to the embodiments of the present invention.

Figure 1:
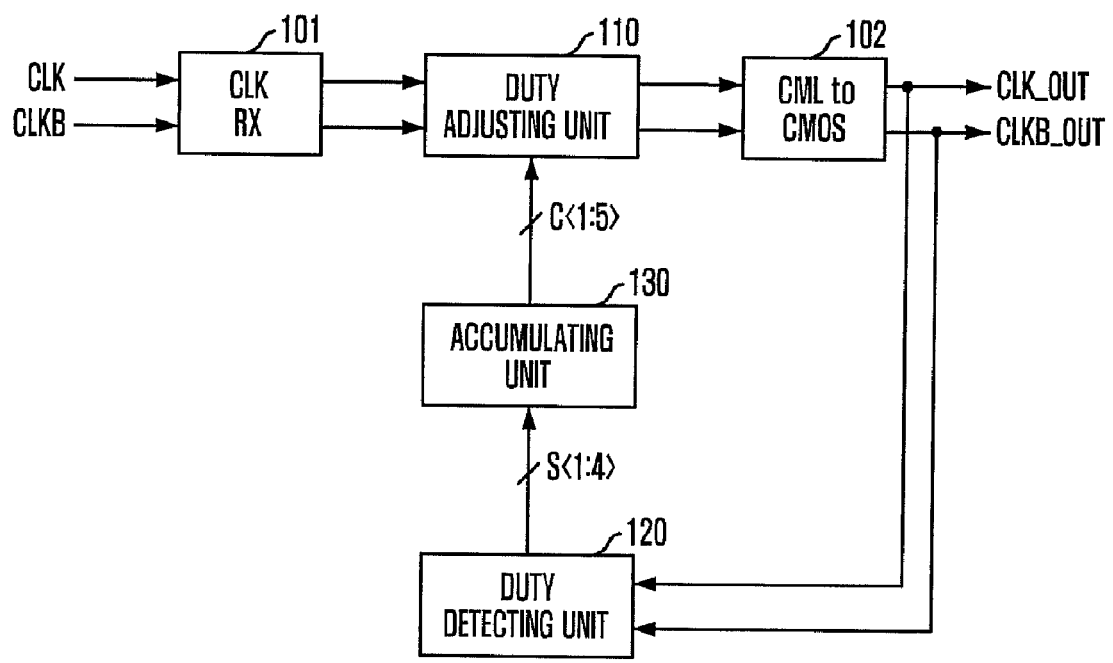
FIG. 1 is a block diagram of a duty cycle corrector in accordance with an embodiment of the present invention.

FIG. 1 is a block diagram of a duty cycle corrector in accordance with an embodiment of the present invention.

Referring to FIG. 1, the duty cycle corrector in accordance with the embodiment of the present invention includes a duty adjusting unit 110, a duty detecting unit 120, and an accumulating unit 130. The duty adjusting unit 110 adjusts duty cycles of input clocks CLK and CLKB in response to a duty correction code C<1:5> to generate output clocks CLK_OUT and CLKB_OUT. The duty detecting unit 120 measures a difference between a high pulse width and a low pulse width of the output clocks CLK_OUT and CLKB_OUT to output difference values S<1:4>. The accumulating unit 130 accumulates the difference values S<1:4> to generate the duty correction code C<1:5>.

To be specific, the duty detecting unit 120 measures the high pulse width and the low pulse width of the output clocks CLK_OUT and CLKB_OUT to output the difference value S<1:4>. The difference value S<1:4> between the high pulse width and the low pulse width represents the distortion degree of the duty cycle of the current clock. Also, the duty detecting unit 120 outputs the up/down signal representing whether the high pulse width is larger or smaller than the low pulse width. The up/down signal is a signal which represents the distorted direction of the duty cycle of the clock.

The conventional duty detecting unit generates only information on the distorted direction of the duty cycle, but does not generate information on the distortion degree of the duty cycle. Therefore, the conventional duty cycle corrector must adjust the duty cycle little by little according to the distorted direction of the duty cycle. Consequently, the conventional duty cycle corrector must operate during several cycles. However, the duty detecting unit in accordance with the embodiment of the present invention generates information S<1:4> on the distortion degree of the duty cycle as well as information on the distorted direction (UP/DN) of the duty cycle. Therefore, the duty cycle corrector can exactly correct the duty cycle in one cycle of operation.

The accumulating unit 130 accumulates the difference value S<1:4> outputted from the duty detecting unit 120 to generate the duty correction code C<1:4>. Accumulating the difference value S<1:4> means adding or subtracting the difference values S<1:4>. Whether to add or subtract the difference value S<1:4> is determined according to the up/down signal. Since the complete information required to correct the duty cycle of the clock is outputted from the duty detecting unit 120, the duty cycle can be exactly corrected in only one cycle of operation. However, due to several factors, the duty cycle may be again distorted even after the duty cycle of the clock is corrected. The accumulating unit 130 is provided for preparing for a case where the duty cycle is again distorted after the duty cycle correction.

For example, if the duty cycle of the clock is distorted by +5 in an initial step (where + means that the high pulse width is larger than the low pulse width), the duty cycle is exactly corrected by adjusting it by +5. However, if the duty cycle is further distorted by +2 after the duty cycle correction, the value of the duty correction code C<1:5> must be set to +7 (=+5+2). This operation is performed by the accumulating unit 130.

The duty adjusting unit 110 adjusts the duty cycles of the input clocks CLK and CLKB in response to the duty correction code C<1:5>. The duty correction code C<1:5> contains information on the distorted direction and distortion degree of the clocks. Thus, it is possible to generate the output clocks CLK_OUT and CLKB_OUT by adjusting the duty cycles of the input clocks CLK and CLKB using the duty correction code C<1:5>.

In FIG. 1, CLKRX 101 represents a clock input terminal, and CML-to-CMOS 102 represents a shifter converting a current mode logic (CML) level clock into a CMOS level clock. Although the duty adjusting unit 110 designed to adjust the duty cycle of the clock swinging at a CML level as illustrated in FIG. 1 is exemplified in the following embodiments, the duty adjusting unit 110 is not a requisite element because whether the duty adjusting unit 110 adjusts the duty cycle of the clock swinging at the CMOS level or the clock swinging at a CML level is an optional issue which is variable according to circumstances.

Figure 2:
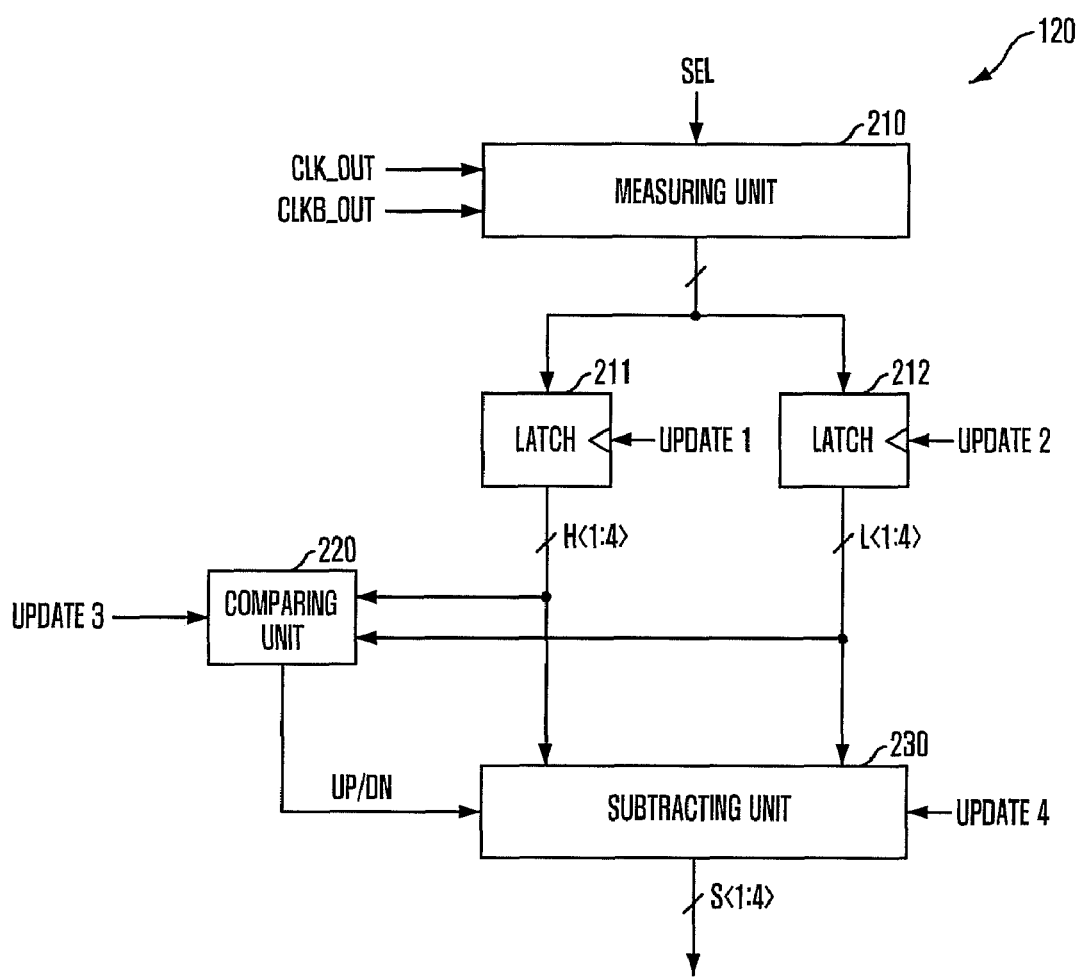
FIG. 2 is a block diagram of a duty detecting unit 120 of FIG. 1 in accordance with an embodiment of the present invention.

FIG. 2 is a block diagram of the duty detecting unit 120 of FIG. 1 in accordance with an embodiment of the present invention.

Referring to FIG. 2, the duty detecting unit 120 includes a measuring unit 210, a comparing unit 220, and a subtracting unit 230. The measuring unit 210 measures the high pulse width of the output clocks CLK_OUT and CLKB_OUT to generate a high pulse code H<1:4>, and measures the low pulse width of the output clocks CLK_OUT and CLKB_OUT to generate a low pulse code L<1:4>. The comparing unit 220 compares the high pulse code H<1:4> with the low pulse code L<1:4> to generate the up/down signal UP/DN representing which code value is larger. The subtracting unit 230 subtracts the smaller value from the larger value of the high pulse code H<1:4> and the low pulse code L<1:4> to generate the difference value code S<1:4>.

The measuring unit 210 measures the high pulse width and the low pulse width of the output clocks CLK_OUT and CLKB_OUT to generate the high pulse code H<1:4> and the low pulse code L<1:4>. The high pulse width and the low pulse width are sequentially measured at the measuring unit 210. The measuring unit 210 measures the high pulse width while a selection signal SEL is at a high level, and measures the low pulse width while the selection signal SEL is at a low level. Therefore, the high pulse code H<1:4> is first outputted through an output terminal of the measuring unit 210, and the low pulse code L<1:4> is then outputted.

Latches 211 and 212 are provided at the output terminal of the measuring unit 210 in order to store the high pulse code H<1:4> and the low pulse code L<1:4>. Although the latches 211 and 212 are illustrated as elements separated from the measuring unit 210, they can be provided within the measuring unit 210. The latches 211 and 212 are configured to store the high pulse code H<1:4> and the low pulse code L<1:4>. It is apparent that the duty detecting unit 120 can be configured without the latches 211 and 212 if the timing of the elements included in the duty detecting unit 120 is appropriately tuned. Update signals UPDATE1 and UPDATE2 inputted to the latches 211 and 212 are signals which determine a timing where the latches 211 and 212 receive the high pulse code H<1:4> and the low pulse code L<1:4>.

The comparing unit 220 compares the high pulse code H<1:4> with the low pulse code L<1:4> to generate the up/down signal UP/DN representing which code is larger. An update signal UPDATE3 inputted to the comparing unit 220 is a signal which determines a timing where the high pulse code H<1:4> and the low pulse code L<1:4> are inputted to the comparing unit 220.

The subtracting unit 230 is configured to calculate the code value difference between the high pulse code H<1:4> and the low pulse code L<1:4>, that is, the difference between the high pulse width and the low pulse width. The subtracting unit 230 determines which one of the high pulse code H<1:4> and the low pulse code L<1:4> is larger by using the up/down signal UP/DN, and generates the difference value code S<1:4> by subtracting the smaller value from the larger value. An update signal UPDATE4 inputted to the subtracting unit 230 is a signal which determines a timing where the high pulse code H<1:4> and the low pulse code L<1:4> are inputted to the subtracting unit 230.

Figure 3:
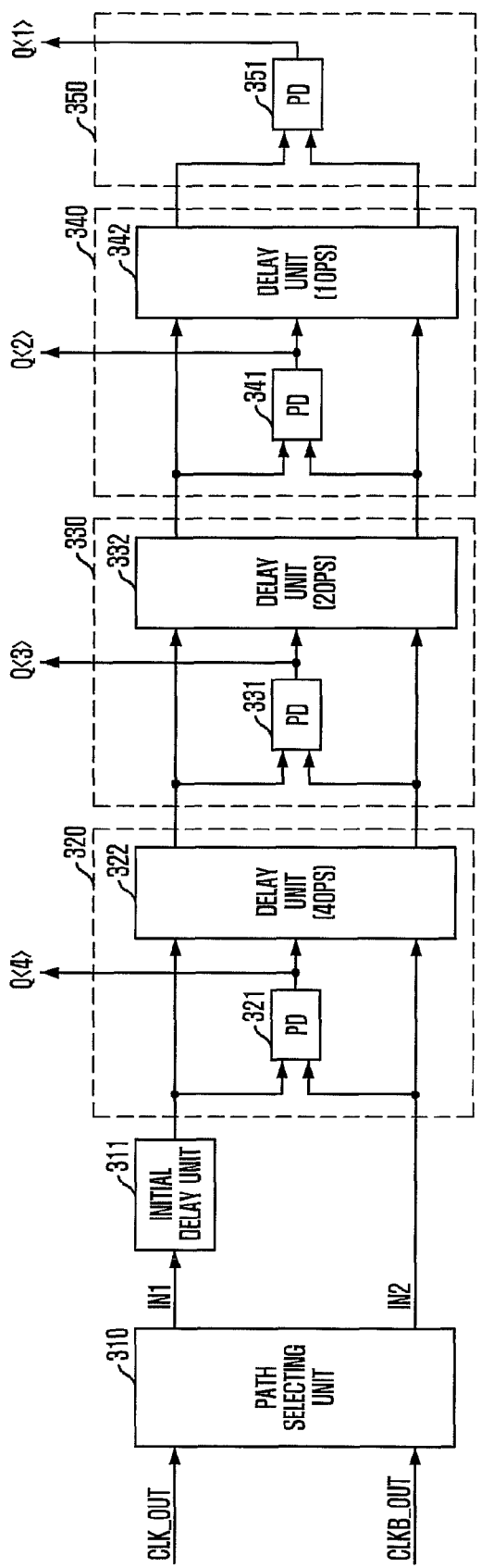
FIG. 3 is a block diagram of a measuring unit 210 of FIG. 2 in accordance with an embodiment of the present invention.

FIG. 3 is a block diagram of the measuring unit 210 of FIG. 2 in accordance with an embodiment of the present invention.

Referring to FIG. 3, the measuring unit 210 includes a path selecting unit 310 and a plurality of selection delay units 320 to 350. The path selecting unit 310 transfers the positive clock CLK_OUT and the negative clock CLKB_OUT to a first path IN1 and a second path IN2, respectively. The plurality of selection delay units 320 to 350 are connected in series to receive the clocks through the first path IN1 and the second path IN2 and measure the high pulse width or the low pulse width.

The path selecting unit 310 transfers the negative clock CLKB_OUT to the first path IN1 and transfers the positive clock CLK_OUT to the second path IN2 while the selection signal SEL is at a low level. The period where the selection signal SEL is at a high level is a period where the high pulse widths of the output clocks CLK_OUT and CLKB_OUT are measured, and the period where the selection signal SEL is at a low level is a period where the low pulse widths of the output clocks CLK_OUT and CLKB_OUT are measured.

The selection delay unit 320 includes a phase comparing unit 321 and a delay unit 322, and the selection delay unit 330 includes a phase comparing unit 331 and a delay unit 332. The selection delay unit 340 includes a phase comparing unit 341 and a delay unit 342, and the selection delay unit 350 includes a phase comparing unit 351. The phase comparing units 321, 331, 341 and 351 compare a phase of the clock of the first path IN1 with a phase of the clock of the second path IN2. The delay units 322, 332 and 342 delay the clock of the first path IN1 or the clock of the second path IN2 according to the comparison results Q<4>, Q<3>, Q<2> and Q<1> of the phase comparing units 321, 331, 341 and 351.

The phase comparing units 321, 331, 341 and 351 output a value of 1 when the rising edge of the clock transferred to the first path IN1 leads the rising edge of the clock transferred to the second path IN2, and output a value of 0 when the rising edge of the clock transferred to the first path IN1 lags behind the rising edge of the clock transferred to the second path IN2. The delay units 322, 332 and 342 delay the clock of the first path IN1 when the comparison results Q<4>, Q<3> and Q<2> of the phase comparing units 321, 331 and 341 are "1", and delay the clock of the second path IN2 when the comparison results Q<4>, Q<3> and Q<2> of the phase comparing units 321, 331 and 341 are "0". The delay units 322, 332 and 342 are designed so that their delay values have binary weights such as 40 pico seconds (ps), 20 ps and 10 ps.

In case where the positive clock CLK_OUT is inputted to the first path IN1 and the negative clock CLKB_OUT is inputted to the second path IN2, the output values Q<4>, Q<3>, Q<2> and Q<1> of the phase comparing units 321, 331, 341 and 351 become high pulse codes H<1:4> (Q<1:4>=H<1:4>). In case where the negative clock CLKB_OUT is inputted to the first path IN1 and the positive clock CLK_OUT is inputted to the second path IN2, the output values Q<4>, Q<3>, Q<2> and Q<1> of the phase comparing units 321, 331, 341 and 351 become low pulse codes L<1:4> (Q<1:4>=L<1:4>).

In FIG. 3, the last selection delay unit 350 does not include a delay unit because there exists no selection delay unit following the selection delay unit 350.

An initial delay unit 311 is provided for achieving fast measurement of the high pulse code H<1:4> and the low pulse code L<1:4> by constantly delaying the clock transferred to the first path IN1. The initial delay unit 311 is not a requisite element. While the measured high pulse code H<1:4> and low pulse code L<1:4> have an error as much as the delay value of the initial delay unit 311, such an error does not matter because the important value for the detection of the duty cycle is not the high pulse code H<1:4> and the low pulse code L<1:4> themselves, but the difference value between the two codes.

In accordance with the embodiment of the present invention, the high pulse code H<1:4> and the low pulse code L<1:4> of the output clocks CLK_OUT and CLKB_OUT are measured using the same selection delay units 320, 330, 340 and 350, and the duty cycle is detected using the difference between the measured high pulse code H<1:4> and low pulse code L<1:4>. Therefore, even if offsets occur at the selection delay units 320, 330, 340 and 350 during the fabrication process, such offsets are eliminated in the process of calculating the difference between the high pulse code H<1:4> and the low pulse code L<1:4>.

Although the high pulse code H<1:4> and the low pulse code L<1:4> are generated through the same selection delay units 320, 330, 340 and 350 while changing the positive clock CLK_OUT and the negative clock CLKB_OUT by using the path selecting unit 310, it is apparent that the selection delay units for measuring the high pulse code H<1:4> and the selection delay units for measuring the low pulse code L<1:4> can be separately provided, without the path selecting unit 310.

Figure 4:
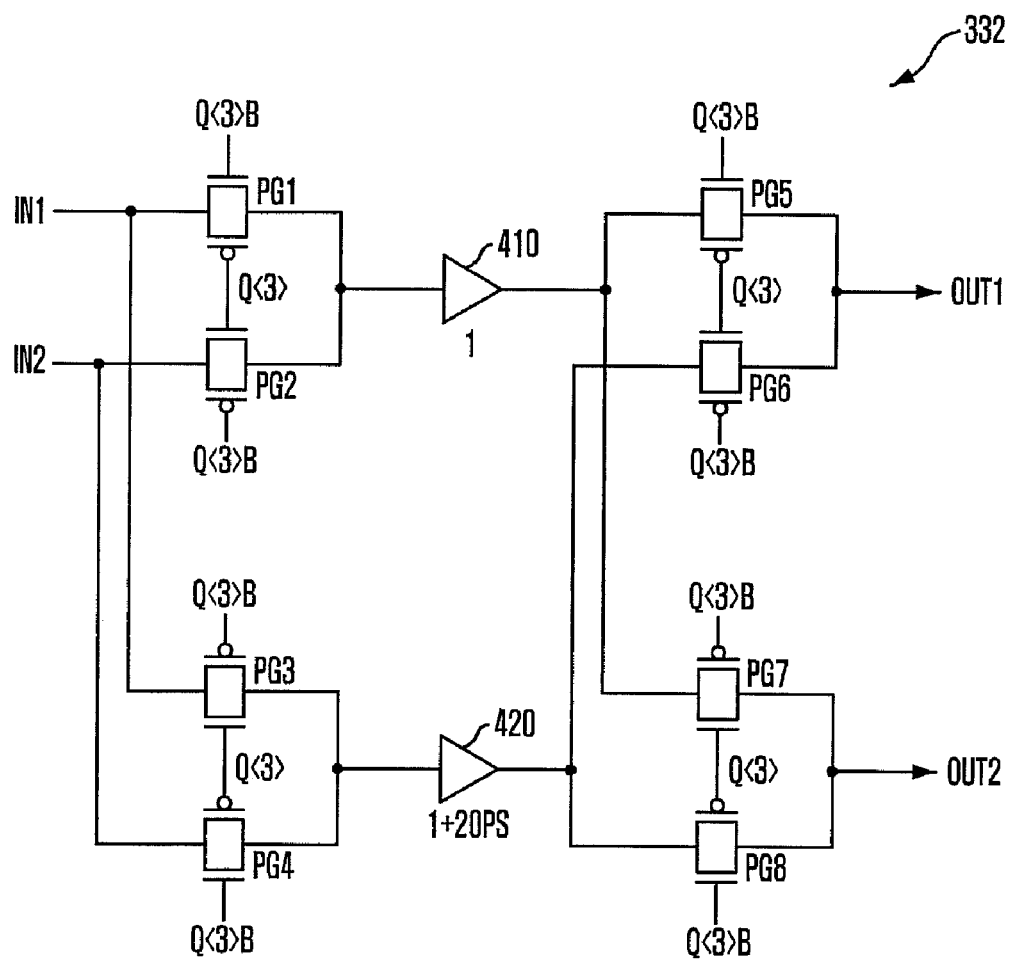
FIG. 4 is a circuit diagram of a delay unit 332 of FIG. 3 in accordance with an embodiment of the present invention.

FIG. 4 is a circuit diagram of the delay unit 332 of FIG. 3 in accordance with an embodiment of the present invention.

Referring to FIG. 4, the delay unit 332 includes a plurality of pass gates PG1 to PG8 and delay elements 410 and 420. The pass gates PG1 to PG8 are turned on/off in response to the output value Q<3> of the phase comparing unit 331.

When the output value Q<3> of the phase comparing unit 331 is "1", the clock of the first path IN1 is outputted as OUT1 through the delay element 420, and the clock of the second path IN2 is outputted as OUT2 through the delay element 410. Therefore, the clock of the first path is further delayed than the clock of the second path IN2 by 20 ps.

When the output value Q<3> of the phase comparing unit 331 is "0", the clock of the first path IN1 is outputted as OUT1 through the delay element 410, and the clock of the second path IN2 is outputted as OUT2 through the delay element 420. Therefore, the clock of the second path IN2 is further delayed than the clock of the first path IN1 by 20 ps.

Since the delay value difference between the delay element 410 and the delay element 420 is important in the embodiment of the present invention, the delay element 420 is designed to have a delay value larger than that of the delay element 410 by a preset value (for example, 20 ps). It is apparent that numerous methods can be used to design the delay elements 410 and 420.

Figure 5A:
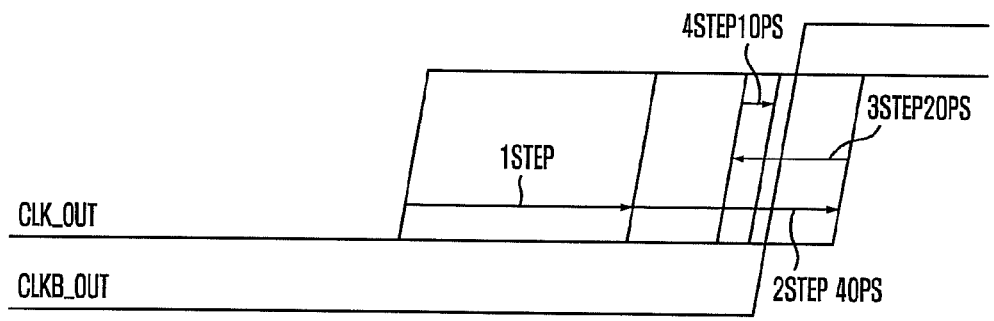
FIG. 5A illustrates the process of generating a high pulse code (H<1:4>) at the measuring unit 210 of FIG. 3.
Figure 5B:
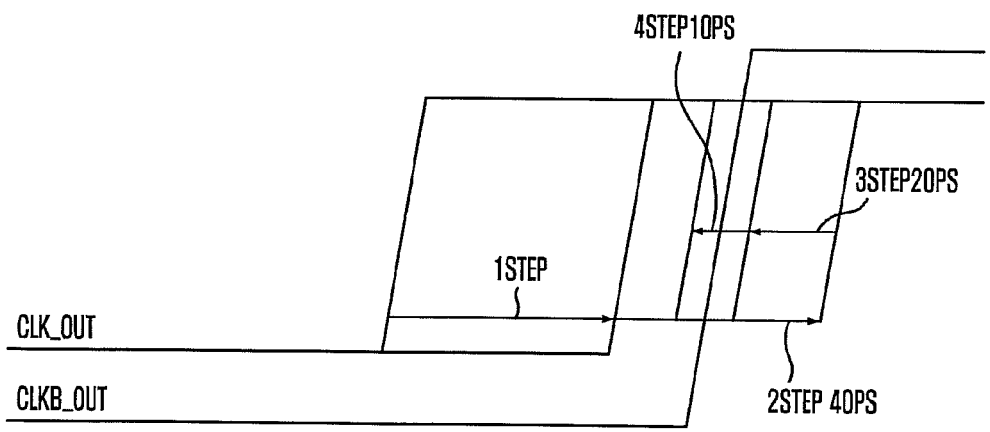
FIG. 5B illustrates the process of generating a low pulse code (L<1:4>) at the measuring unit 210 of FIG. 3.

FIG. 5A illustrates the process of generating the high pulse code H<1:4> at the measuring unit 210 of FIG. 3, and FIG. 5B illustrates the process of generating the low pulse code L<1:4> at the measuring unit 210.

Specifically, FIG. 5A illustrates the process of measuring the high pulse code H<1:4> when the positive clock CLK_OUT is inputted to the first path IN1 and the negative clock CLKB_OUT is inputted to the second path IN2.

First, the positive clock CLK_OUT is delayed by the delay value of the initial delay unit 311 (1STEP). Although the positive clock CLK_OUT is delayed by the initial delay unit 311, the rising edge of the positive clock CLK_OUT still leads the rising edge of the negative clock CLKB_OUT. Thus, the output value Q<4> of the phase comparing unit 321 becomes "1", and the delay unit 322 further delays the positive clock CLK_OUT with respect to the negative clock CLKB_OUT by 40 ps (2STEP). In this case, the rising edge of the positive clock CLK_OUT lags behind the rising edge of the negative clock CLKB_OUT. Therefore, the output value Q<3> of the phase comparing unit 331 becomes "0" and the delay unit 332 further delays the negative clock CLKB_OUT with respect to the positive clock CLK_OUT by 20 ps (3STEP), which is illustrated in such a way that the positive clock is shifted backward by 20 ps. Consequently, the rising edge of the positive clock CLK_OUT again leads the rising edge of the negative clock CLKB_OUT. Therefore, the output value Q<2> of the phase comparing unit 341 becomes "1" and the delay unit 342 further delays the positive clock CLK_OUT by 10 ps (4STEP). The rising edge of the positive clock CLK_OUT still leads the rising edge of the negative clock CLKB_OUT. Thus, the output value Q<1> of the phase comparing unit 351 becomes "1". Since the output values Q<1:4> of the phase comparing units 321, 341 and 351 become the high pulse code H<1:4>, the high pulse code H<1:4> has a value of "1011".

FIG. 5B illustrates the process of measuring the low pulse code L<1:4> when the negative clock CLKB_OUT is inputted to the first path IN1 and the positive clock CLK_OUT is inputted to the second path IN2.

First, the negative clock CLKB_OUT is delayed by the delay value of the initial delay unit 311 (1STEP). Although the negative clock CLKB_OUT is delayed by the initial delay unit 311, the rising edge of the negative clock CLKB_OUT still leads the rising edge of the positive clock CLK_OUT. Thus, the output value Q<4> of the phase comparing unit 321 becomes "1", and the delay unit 322 further delays the negative clock CLKB_OUT with respect to the positive clock CLK_OUT by 40 ps (2STEP). In this case, the rising edge of the negative clock CLKB_OUT lags behind the rising edge of the positive clock CLK_OUT. Therefore, the output value Q<3> of the phase comparing unit 331 becomes "0" and the delay unit 332 further delays the positive clock CLK_OUT with respect to the negative clock CLKB_OUT by 20 ps (3STEP), which is illustrated in such a way that the negative clock is shifted backward by 20 ps. The rising edge of the negative clock CLKB_OUT still lags behind the rising edge of the positive clock CLK_OUT. Therefore, the output value Q<2> of the phase comparing unit 341 becomes "0" and the delay unit 342 further delays the negative clock CLKB_OUT than positive clock CLK_OUT by 10 ps (4STEP), which is illustrated in such a way that the negative clock CLKB_OUT is shifted backward by 10 ps. In this case, the rising edge of the negative clock CLKB_OUT leads the rising edge of the positive clock CLK_OUT. Thus, the output value Q<1> of the phase comparing unit 351 becomes "1". Since the output values Q<1:4> of the phase comparing units 331 and 341 become the low pulse code L<1:4>, the low pulse code H<1:4> has a value of "1001".

Figure 6:
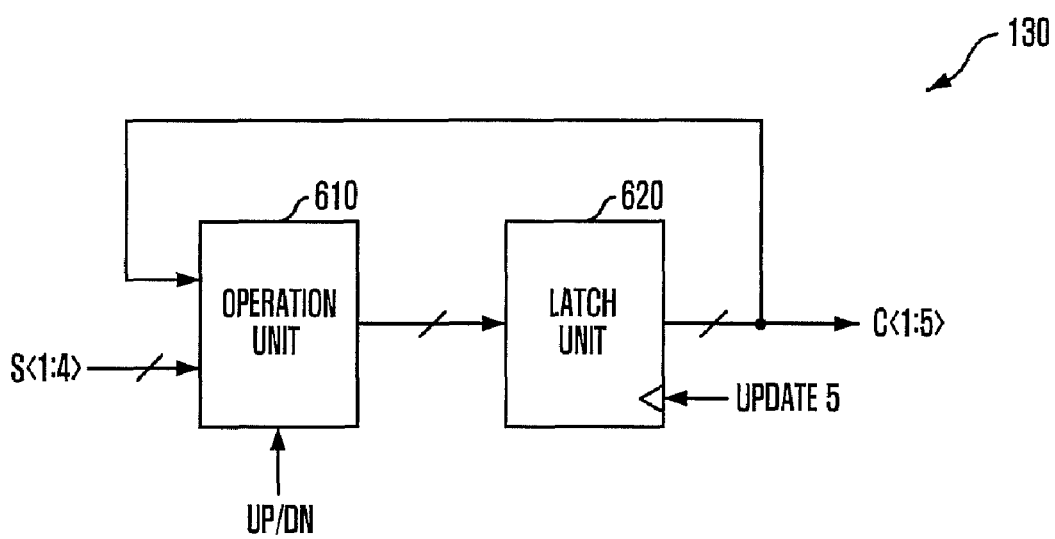
FIG. 6 is a block diagram of an accumulating unit 130 of FIG. 1 in accordance with an embodiment of the present invention.

FIG. 6 is a block diagram of the accumulating unit 130 of FIG. 1 in accordance with an embodiment of the present invention.

Referring to FIG. 6, the accumulating unit 130 includes a latch unit 620 and an operation unit 610. The latch unit 620 stores the duty correction code C<1:5>. The operation unit 610 adds or subtracts the difference value S<1:4> to/from the duty correction code C<1:5> stored in the latch unit 620 according to the up/down signal UP/DN.

The latch unit 620 stores a value that will disable the duty adjusting unit 110 from performing the duty cycle correction, as the initial value of the duty correction code C<1:5>. In the current embodiment, the value is "10000". Thereafter, the latch unit 620 stores the operation results of the operation unit 610 as the duty correction code C<1:5>. An update signal UPDATE5 is a signal which determines a timing of storing the operation result of the operation unit 610 in the latch unit 620.

The operation unit 610 is configured to add or subtract the difference value code S<1:4> to/from the duty correction code C<1:5> stored in the latch unit 620. When the up/down signal UP/DN has a high value, the difference value code S<1:4> is added to the duty correction code C<1:5>. When the up/down signal UP/DN has a low value, the difference value code S<1:4> is subtracted from the value stored in the latch unit 620.

For example, in case where the duty correction code C<1:5> is "10000", if the up/down signal UP/DN is at a high level and the difference value code S<1:4> of "0011" is inputted, the following duty correction code C<1:5> becomes "10011". Furthermore, in case where the duty correction code C<1:5> is "10000", if the up/down signal UP/DN is at a low level and the difference value code S<1:4> of "0011" is inputted, the following duty correction code C<1:5> becomes "01101".

Figure 7:
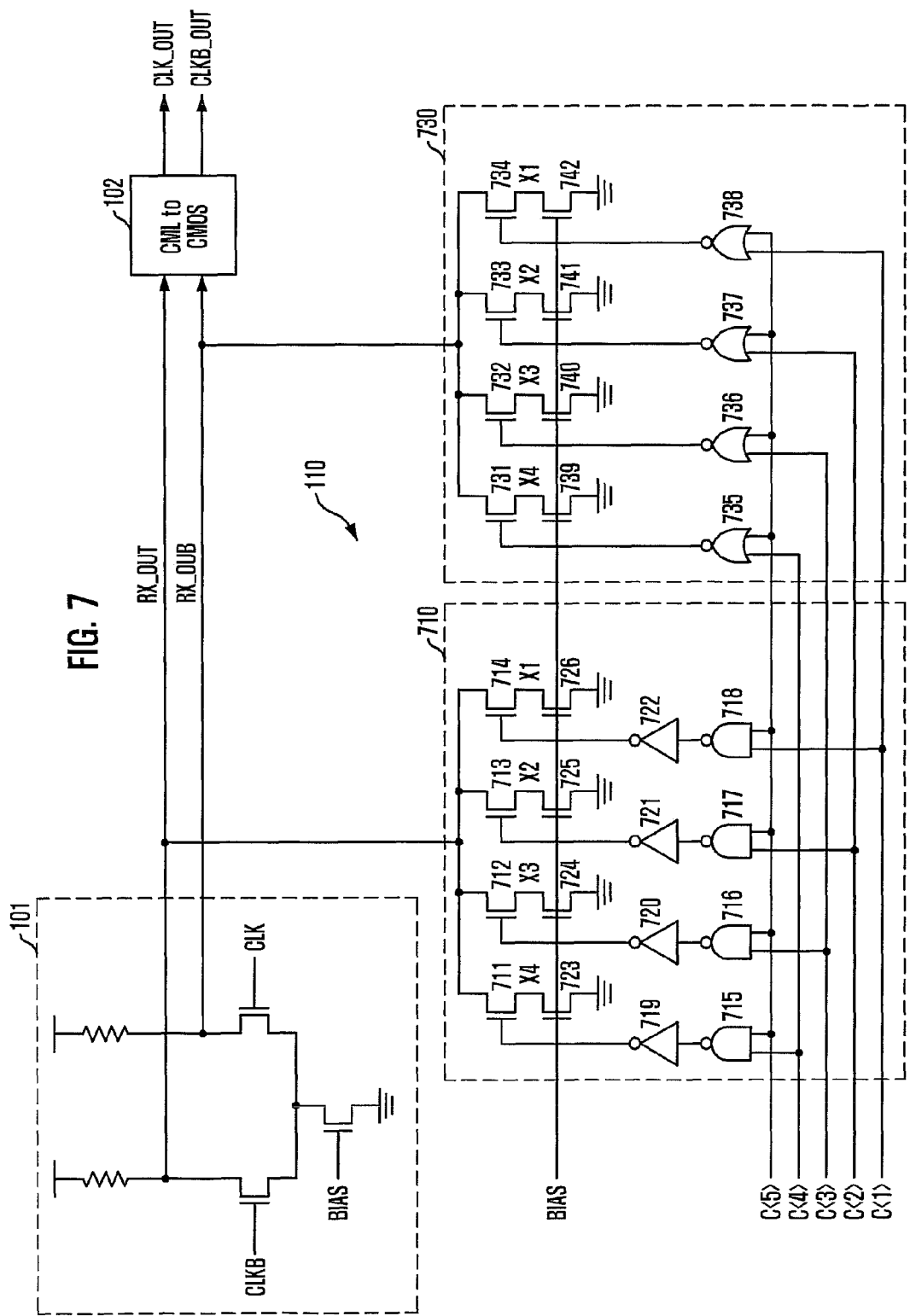
FIG. 7 is a circuit diagram of a duty adjusting unit 110 of FIG. 1 in accordance with an embodiment of the present invention.

FIG. 7 is a circuit diagram of the duty adjusting unit 110 of FIG. 1 in accordance with an embodiment of the present invention.

Referring to FIG. 7, the duty adjusting unit 110 includes a positive clock adjusting unit 710 and a negative clock adjusting unit 730. The positive clock adjusting unit 710 adjusts a level of a positive clock RX_OUT of the input clock CLK and CLKB, and the negative clock adjusting unit 730 adjusts a level of a negative clock RX_OUTB. The positive clock RX_OUT corresponds to an output of the clock CLK, and the negative clock RX_OUTB corresponds to an output of the clock CLKB.

The positive clock adjusting unit 710 corrects the duty cycle by adjusting the level of the positive clock RX_OUT by using transistors 711 to 714 having binary weights. The positive clock adjusting unit 710 operates when the most significant bit C<5> of the duty correction code C<1:5> has a value of "1". That the most significant bit C<5> of the duty correction code C<1:5> has a value of "1" means that the value of the high pulse code H<1:4> is greater than that of the low pulse code L<1:4>. Thus, the level of the positive clock RX_OUT needs to be reduced in order for the duty cycle correction.

When the most significant bit C<5> of the duty correction code C<1:5> is "1", output values of inverters 719 to 722 connected to output terminals of NAND gates 715 to 718 are determined by the values of the duty correction code C<1:4>. The values of the duty correction code C<1:4> except the most significant bit C<5> represent how much the high pulse width is greater than the low pulse width. Thus, if the transistors 711 to 714 are turned on according to the values of the duty correction code C<1:4>, the level of the positive clock RX_OUT is lowered in proportion to the values of the duty correction code C<1:4>. This means that the high pulse width is reduced in proportion to the values of the duty correction code C<1:4>.

The negative clock adjusting unit 730 corrects the duty cycle by adjusting the level of the negative clock RX_OUTB by using transistors 731 to 734 having binary weights. The negative clock adjusting unit 730 operates when the most significant bit C<5> of the duty correction code C<1:5> has a value of "0". That the most significant bit C<5> of the duty correction code C<1:5> has a value of "0" means that the value of the low pulse code L<1:4> is greater than that of the high pulse code H<1:4>. Thus, the level of the negative clock RX_OUTB needs to be reduced in order for the duty cycle correction.

When the most significant bit C<5> of the duty correction code C<1:5> is "0", output values of NOR gates 735 to 738 are opposite to the values of the duty correction code C<1:4>. This means that transistors 731 to 734 are turned on in proportion to the difference between the initial value "10000" of the duty correction code C<1:5> and the value of the current duty correction code C<1:5>. That is, the transistors 731 to 734 are turned on in proportion to how much the low pulse width is greater than the high pulse width, and thus, the low pulse width is reduced.

In summary, when the duty correction code C<1:5> is greater than the initial value "10000", the duty adjusting unit 110 reduces the level of the positive clock RX_OUT as much. Also, when the duty correction code C<1:5> is less than the initial value "10000", the duty adjusting unit 110 reduces the level of the negative clock RX_OUTB as much.

The transistors 723 to 726 and 739 to 742 receiving a bias voltage BIAS prevent the excessive increase of the current flowing through the respective nodes.

Figure 8:
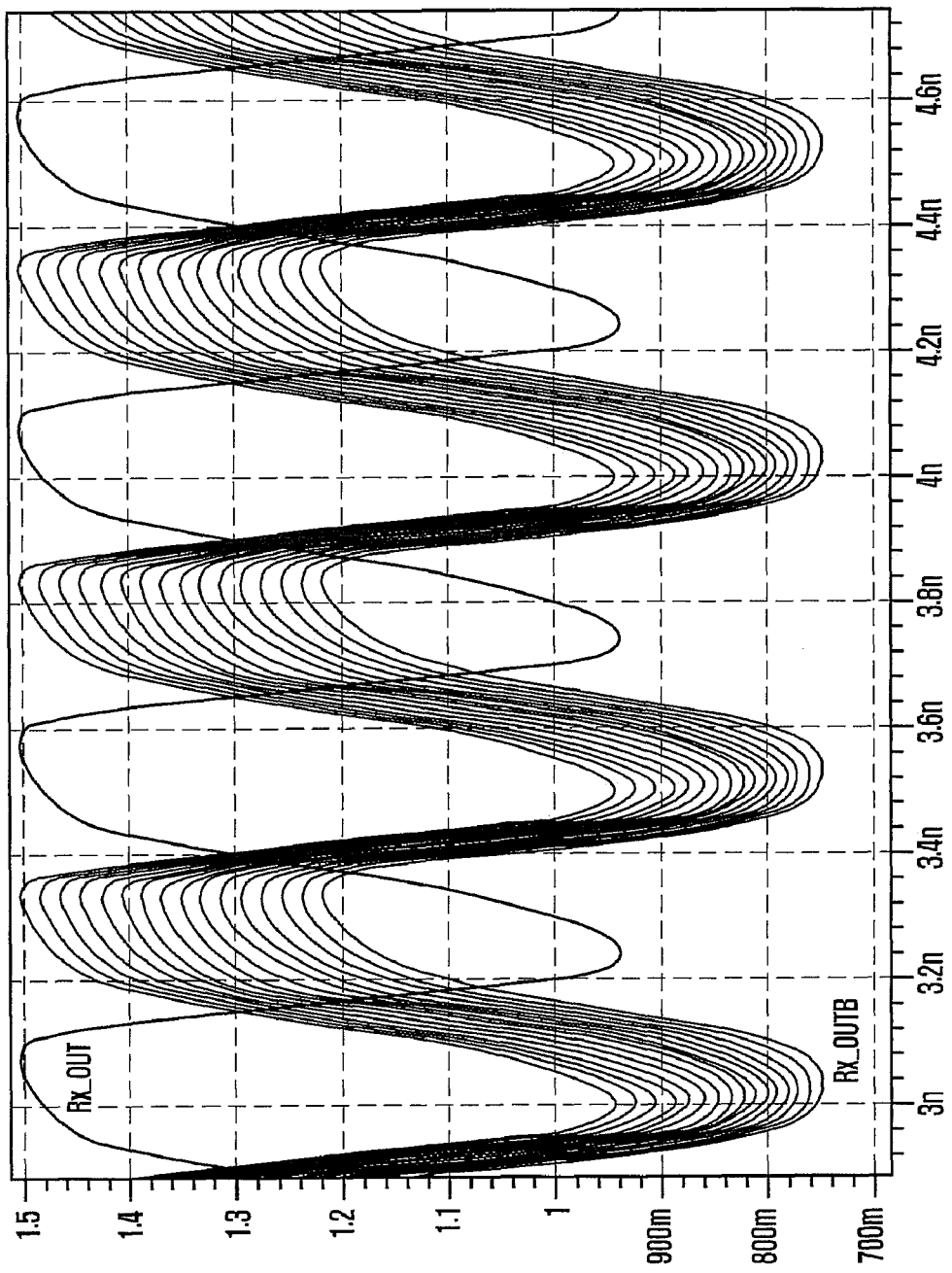
FIG. 8 illustrates a duty cycle correction of the duty adjusting unit 110.

FIG. 8 illustrates the duty cycle correction of the duty adjusting unit 110.

Specifically, FIG. 8 illustrates a case where the most significant bit C<5> of the duty correction code C<1:5> is "0", that is, the negative clock adjusting unit 730 operates. FIG. 8 shows the decreasing degree of the negative clock RX_OUTB according to the duty correction code C<1:4>.

The high pulse width of the clock is defined by a range from an intersecting point of the rising edge of the positive clock RX_OUT and the falling edge of the negative clock RX_OUTB to an intersecting point of the falling edge of the positive clock RX_OUT and the rising edge of the negative clock RX_OUTB. Also, the low pulse width of the clock is defined by a range from an intersecting point of the falling edge of the positive clock RX_OUT and the rising edge of the negative clock RX_OUTB to an intersecting point of the rising edge of the positive clock RX_OUT and the falling edge of the negative clock RX_OUTB.

Figure 9:
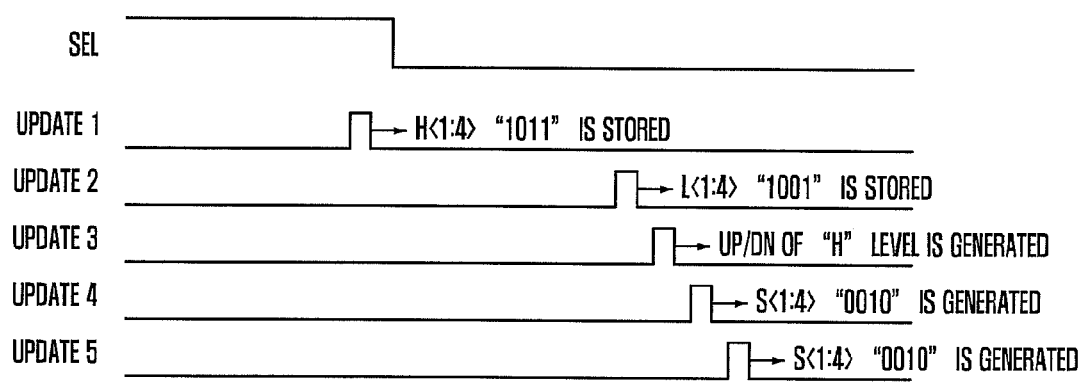
FIG. 9 illustrates the overall operation of the duty cycle corrector in accordance with the embodiment of the present invention.

FIG. 9 illustrates the overall operation of the duty cycle corrector in accordance with the embodiment of the present invention.

First, when the selection signal SEL is at the high level, the path selecting unit 310 transfers the positive clock CLK_OUT of the output clocks to the first path IN1 and transfers the negative clock CLKB_OUT to the second path IN2. Thus, the high pulse width is measured at the measuring unit 210. After completing the generation of the high pulse code H<1:4>, the update signal UPDATE1 is activated so that the high pulse code H<1:4> is stored in the latch 211. Hereinafter, the measured value of the high pulse code H<1:4> is assumed to be "1011".

When the selection signal SEL has a low value, the path selecting unit 310 transfers the negative clock CLKB_OUT to the first path IN1 and transfers the positive clock CLK_OUT to the second path IN2. Thus, the low pulse width is measured at the measuring unit 210. After completing the generation of the low pulse code L<1:4>, the update signal UPDATE2 is activated and the low pulse code L<1:4> is stored in the latch 212. Hereinafter, the measured value of the low pulse code L<1:4> is assumed to be "1001".

As the update signal UPDATE3 is activated, the high pulse code H<1:4> "1011" and the low pulse code L<1:4> "1001" are inputted to the comparing unit 220. Since the high pulse code H<1:4> "1011" has a greater value than the low pulse code L<1:4> "1001", the comparing unit 220 outputs the up/down signal UP/DN having a high level.

As the update signal UPDATE4 is activated, the high pulse code H<1:4> "1011", the low pulse code L<1:4> "1001", and the up/down signal UP/DN are inputted to the subtracting unit 230. Since the up/down signal UP/DN is at the high level, the subtracting unit 230 generates "0010" as the difference value code S<1:4> obtained by subtracting the low pulse code L<1:4> "1001" from the high pulse code H<1:4> "1011".

The operation unit 610 of the accumulating unit 130 adds the difference value code S<1:4> "0010" to the initial value "10000" of the duty correction code C<1:5> stored in the latch unit 620. As the signal UPDATE5 is activated, the operation result of the operation unit 610 is stored in the latch unit 620 as a new duty correction code C<1:5> "10010".

Since the most significant bit C<5> of the duty correction code C<1:5> "10010" is "1", the positive clock adjusting unit 710 of the duty adjusting unit 110 operates. The positive clock adjusting unit 710 corrects the duty cycle by lowering the level of the positive clock RX_OUT in proportion to the value of the duty correction code C<1:4> "0010".

The selection signal SEL and the update signals UPDATE1 to UPDATE5 have only to be activated in sequence as illustrated in FIG. 9. Since the generation of those signals is obvious to those of ordinary skill in the art, further detailed description thereof will be omitted.

Figure 10:
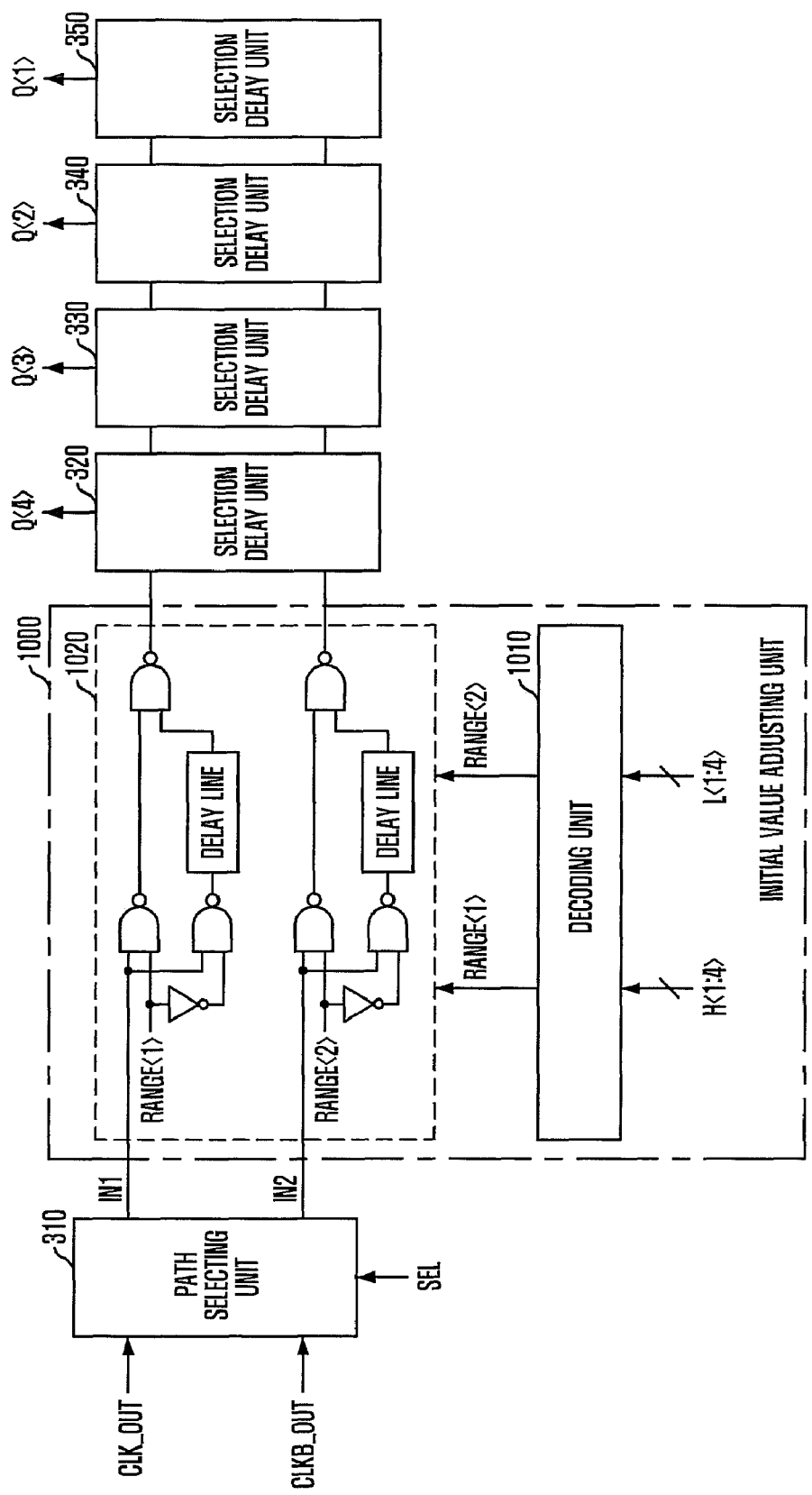
FIG. 10 is a circuit diagram illustrating the measuring unit 210 which further includes an initial value adjusting unit 1000.

FIG. 10 is a circuit diagram illustrating the measuring unit 210 which further includes an initial value adjusting unit 1000.

If the frequencies of the clocks CLK_OUT and CLKB_OUT are varied, the high pulse width and the low pulse width of the clocks CLK_OUT and CLKB_OUT are also varied. Therefore, the measuring unit 210 may not correctly measure the high pulse width and the low pulse width of the clocks CLK_OUT and CLKB_OUT according to the frequency variation of the clocks CLK_OUT and CLKB_OUT.

For example, it is assumed that the high pulse code H<1:4> or the low pulse code L<1:4> is measured to be "1111". When the high pulse code H<1:4> or the low pulse code L<1:4> is measured to be a maximum value "1111", it may be considered that the high pulse width or the low pulse width is out of the measurable range of the measuring unit 210. On the other hand, when the high pulse code H<1:4> or the low pulse code L<1:4> is measured to be a minimum value "0000", it may be considered that the high pulse width or the low pulse width is out of the measurable range of the measuring unit 210.

In order to prepare for those cases, the measuring unit 210 of FIG. 10 further includes an initial value adjusting unit 1000.

The initial value adjusting unit 1000 receives the high pulse code H<1:4> and the low pulse code L<1:4> stored in the latches 211 and 212 and changes an initial delay value of the first path IN1 or the second path IN2 when the value of the high pulse code H<1:4> or the low pulse code L<1:4> has the maximum value "1111" or the minimum value "0000".

That the high pulse code H<1:4> or the low pulse code L<1:4> is measured to be the maximum value "1111" means that the delay value of the initial delay unit 311 is less than a value necessary for accurate measurement. In this case, the delay value of the first path IN1 is made to increase. Also, that the high pulse code H<1:4> or the low pulse code L<1:4> is measured to be the minimum value "0000" means that the delay value of the initial delay unit 311 is greater than a value necessary for accurate measurement. In this case, the delay value of the second path IN2 is made to increase.

The initial value adjusting unit 1000 may include a decoding unit 1010 and a delay unit 1020. The decoding unit 1010 activates a range signal RANGE<1> to a low level when the high pulse code H<1:4> or the low pulse code L<1:4> is measured to be the maximum value. In addition, the decoding unit 1010 activates a range signal RANGE<2> to a low level when the high pulse code H<1:4> or the low pulse code L<1:4> is measured to be the minimum value.

The delay unit 1020 increases the delay value of the first path IN1 when the range signal RANGE<1> is activated to the low level, and increases the delay value of the second path IN2 when the range signal RANGE<2> is activated to the low level. In this way, the high pulse code H<1:4> and the low pulse code L<1:4> can be correctly generated.

As illustrated in FIG. 10, when the measuring unit 210 is designed to include the initial value adjusting unit 1000, it is possible to vary the high pulse width and the low pulse width which can be measured by the measuring unit 210. Thus, even though clocks having various frequencies are inputted, the accurate operation is ensured.

Figure 11:
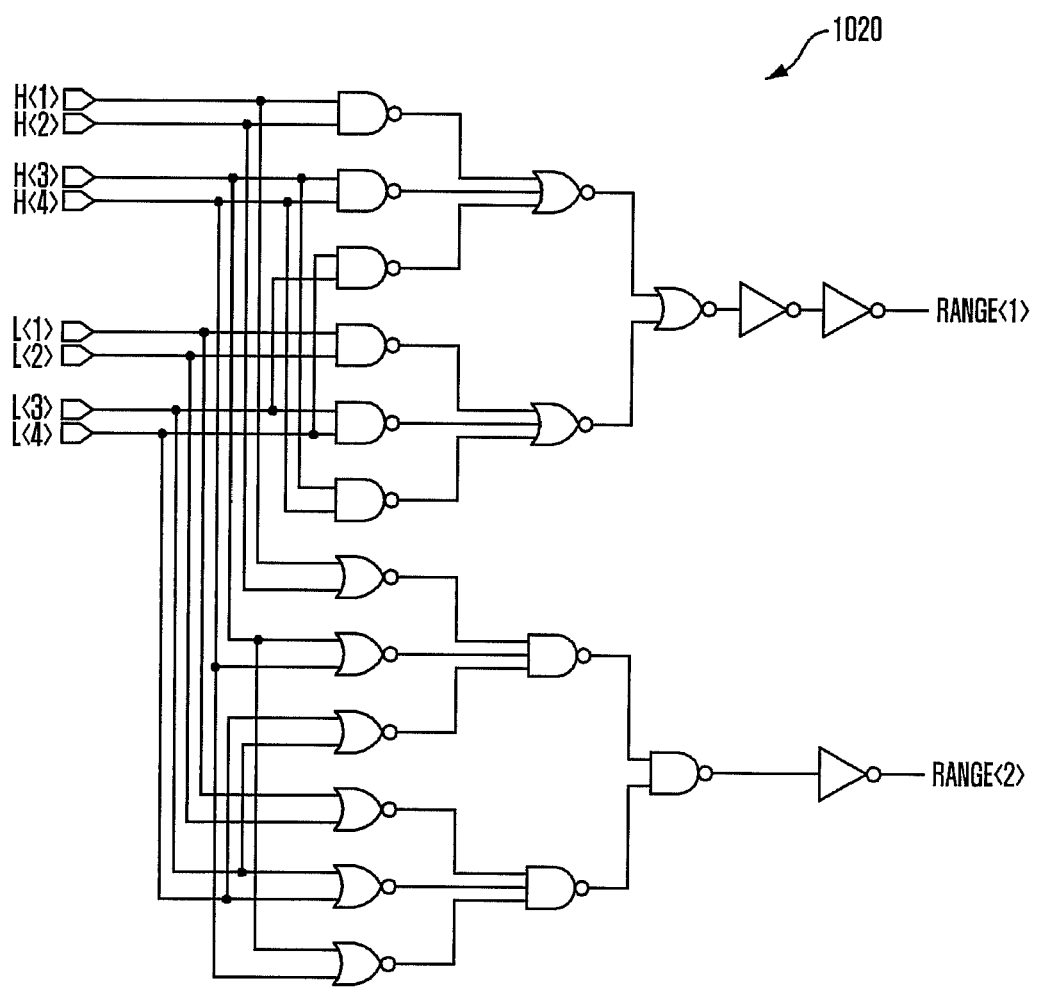
FIG. 11 is a circuit diagram of a decoding unit 1020 of FIG. 10 in accordance with an embodiment of the present invention.

FIG. 11 is a circuit diagram of the decoding unit 1020 of FIG. 10 in accordance with an embodiment of the present invention.

The decoding unit 1020 performs a decoding operation to activate the range signals RANGE<1> and RANGE<2> as shown in Table 1 below. Although activation conditions of the range signals RANGE<1> and RANGE<2> are shown in Table 1, both the range signals RANGE<1> and RANGE<2> maintain the deactivated state in the case of the combination of the codes H<1:4> and L<1:4> which are not listed in Table 1.

TABLE 1

|  | H<4> | H<3> | H<2> | H<1> | L<4> | L<3> | L<2> | L<1> |
|---|---|---|---|---|---|---|---|---|
| RANGE<1> Activated to Low Level | 1 1 | 1 1 | 1 X | 1 X | 1 1 | 1 1 | X 1 | X 1 |
| RANGE<1> Activated to Low Level | 0 0 | 0 0 | 0 X | 0 X | 0 0 | 0 0 | X 0 | X 0 |

In Table 1 above, "X" represents that the high pulse code H<1:4> and the low pulse code L<1:4> may have any value, either "0" or "1".

The range signal RANGE<1> is activated when the high pulse code H<1:4> and/or the low pulse code L<1:4> are/is the maximum value "1111" and its difference from the other code value is small (less than 00XX). The range signal RANGE<1> can be activated only if one or more of the high pulse code H<1:4> and the low pulse code L<1:4> are the maximum value. However, that the difference between the two codes H<1:4> and L<1:4> is large may mean that there is a great error in the measured values of the codes H<1:4> and L<1:4>. Thus, the decoding unit 1020 is designed to perform the decoding operation in the above-described way. When both the two codes H<1:4> and L<1:4> are measured to be a value close to the maximum value, there is high possibility that the codes H<1:4> and L<1:4> are incorrectly measured.

The range signal RANGE<2> is activated when the high pulse code H<1:4> and/or the low pulse code L<1:4> are/is the minimum value "0000" and its difference from the other code value is small (less than 00XX). For the same reason as the case of the range signal RANGE<1>, the decoding unit 1020 is not designed to activate the range signal RANGE<2> only if one or more of the high pulse code H<1:4> and the low pulse code L<1:4> are the minimum value.

In accordance with the embodiments of the present invention, the duty cycle corrector measures the high pulse width and the low pulse width and corrects the duty cycle by using the difference of the measured values. Thus, the locking time is remarkably reduced, as opposed to the related art, because the duty ratio is corrected through only one cycle of operation.

Furthermore, since the high pulse width and the low pulse width are measured through the same configuration and only the difference of the measured values is used, the offsets generated in measuring the high pulse width and the low pulse width are eliminated.

While the present invention has been described with respect to the specific embodiments, it will be apparent to those skilled in the art that various changes and modifications may be made without departing from the spirit and scope of the invention as defined in the following claims.

What is claimed is:

1. A duty cycle corrector, comprising:
    a duty adjusting unit configured to adjust a duty cycle of an input clock in response to a duty correction code and generate an output clock;
    a duty detecting unit configured to measure a high pulse width and a low pulse width of the output clock and to output a difference value between a measured high pulse width and a measured low pulse width; and
    an accumulating unit configured to accumulate the difference value to generate the duty correction code.

2. The duty cycle corrector of claim 1, wherein the duty detecting unit outputs an up/down signal representing which one of the high pulse width and the low pulse width is larger, together with the difference value.

3. The duty cycle corrector of claim 2, wherein the accumulating unit adds or subtracts the difference value to or from an existing duty correction code, respectively.

4. The duty cycle corrector of claim 1, wherein the duty detecting unit comprises:
    a measuring unit configured to measure the high pulse width of the output clock to generate a high pulse code, and measure the low pulse width of the output clock to generate a low pulse code;
    a comparing unit configured to compare the high pulse code with the low pulse code to generate an up/down signal representing which one of the high pulse code and the low pulse code is larger; and
    a subtracting unit configured to generate the difference value by subtracting the smaller one from the larger one of the high pulse code and the low pulse code in value.

5. The duty cycle corrector of claim 4, wherein the measuring unit comprises a plurality of selection delay units connected in series to receive a positive clock of the output clock and a negative clock of the output clock to measure the high pulse width or the low pulse width, each of the selection delay units comprising:
    a phase comparing unit configured to compare a phase of the positive clock with a phase of the negative clock; and
    a delay unit configured to delay the positive clock or the negative clock according to the comparison result of the phase comparing unit.

6. The duty cycle corrector of claim 5, wherein the measuring unit sequentially measures the high pulse width and the low pulse width, and the selection delay units receive the positive clock and the negative clock when measuring the high pulse width at a couple of terminals having switched roles in providing the positive clock and the negative clock when measuring the low pulse width.

7. The duty cycle corrector of claim 6, wherein the comparison result outputted from the phase comparing unit is the high pulse code or the low pulse code.

8. The duty cycle corrector of claim 4, wherein the accumulating unit comprises:
    a latch unit configured to store the duty correction code; and
    an operation unit configured to add or subtract the difference value to or from the duty correction code, respectively, which is stored in the latch unit, according to the up/down signal.

9. The duty cycle corrector of claim 1, wherein the duty adjusting unit corrects a duty cycle by adjusting an entire level of the clock in response to the duty correction code.

10. A duty detecting circuit, comprising:
    a measuring unit configured to measure a high pulse width of a clock to generate a high pulse code, and measure a low pulse width of the clock to generate a low pulse code;
    a comparing unit configured to compare the high pulse code with the low pulse code to generate an up/down signal representing which one of the high pulse code and the low pulse code is larger; and a subtracting unit configured to generate a difference value by subtracting the smaller one from the larger one of the high pulse code and the low pulse code in value.

11. The duty detecting circuit of claim 10, wherein the measuring unit comprises:

a path selecting unit configured to transfer a positive clock of the clock to one of a first path and a second path and transfer a negative clock of the clock to the other one of the first path and the second path; and a plurality of selection delay units connected in series to receive the clocks transferred through the first path and the second path and measure the high pulse width and the low pulse width, each of the selection delay units comprising:

a phase comparing unit configured to compare a phase of the clock of the first path with a phase of the clock of the second path; and a delay unit configured to delay the clock of the first path or the clock of the second path according to the comparison result of the phase comparing unit.

12. The duty detecting circuit of claim 11, wherein the measuring unit sequentially measures the high pulse width and the low pulse width, and the first and second paths assigned for transferring the positive clock and the negative clock have switched roles in transferring the clocks when the high pulse width and the low pulse width are measured.

13. The duty detecting circuit of claim 12, further comprising:

an initial value adjusting unit disposed at a following stage of the path selecting unit to adjust an initial delay value of the first path or the second path when one of the high pulse code or the low pulse code has a maximum value or a minimum value.

14. The duty detecting circuit of claim 12, further comprising:

an initial value adjusting unit disposed at a following stage of the path selecting unit to adjust an initial delay value of the first path or the second path when one of the high pulse code or the low pulse code has a maximum value or a minimum value and a difference between the high pulse code and the low pulse code is less than a preset value.

15. A method for detecting pulse widths of a clock, comprising:

measuring a high pulse width of the clock to generate a high pulse code;

measuring a low pulse width of the clock to generate a low pulse code;

comparing the high pulse code with the low pulse code to generate an up/down signal representing which one of the high pulse code and the low pulse code is larger; and generating a difference value by subtracting the smaller one from the larger one of the high pulse code and the low pulse code in value.

16. The method of claim 15, wherein the high pulse width and the low pulse width of the clock are measured by:

transferring a positive clock of the clock to one of a first path and a second path and transfer a negative clock of the clock to the other one of the first path and the second path;

comparing a phase of the clock of the first path with a phase of the clock of the second path at each selection delay unit of a plurality of selection delay units connected in series; and delaying at each delay unit of a plurality of selection delay units connected in series one of the positive and negative clocks in response to a comparison result by a phase comparing unit corresponding to the delay unit.

17. The method of claim 16, wherein measuring of the high pulse width and measuring of the low pulse width of the clock are sequentially performed and the first and second paths assigned for transferring the positive clock and the negative clock have switched roles in transferring the positive and negative clocks when measuring of the high pulse width and the low pulse width switches from a measurement of one of the high pulse width and the low pulse width to the other one of the high pulse width and the low pulse width.

\* \* \* \* \*